United States Patent [19]
Wolfe et al.

[11] Patent Number: 5,179,342
[45] Date of Patent: Jan. 12, 1993

[54] SUPERCONDUCTOR QUENCH MEASURING DEVICE WHICH EVALUATES REFLECTED PULSES

[75] Inventors: William R. Wolfe, Penn Hills; James R. Logan, Hampton Township, Allegheny County; Eric P. Shook, West Mifflin, all of Pa.

[73] Assignee: Westinghouse Electric Corp., Pittsburgh, Pa.

[21] Appl. No.: 653,571

[22] Filed: Feb. 11, 1991

[51] Int. Cl.$^5$ .................................. G01R 31/11
[52] U.S. Cl. ............................ 324/533; 324/527; 324/71.6; 505/843
[58] Field of Search ............... 324/71.6, 527, 532, 324/533, 534; 505/842, 843

[56] References Cited
U.S. PATENT DOCUMENTS

| | | | |
|---|---|---|---|
| 3,510,762 | 5/1970 | Leslie | 324/534 |
| 4,023,412 | 5/1977 | Luke et al. | 324/534 X |
| 4,371,943 | 2/1983 | Woods et al. | 324/71.6 X |
| 4,978,922 | 12/1990 | Mallick, Jr. et al. | 505/843 X |
| 4,996,472 | 2/1991 | Mallick, Jr. | 324/71.6 |

*Primary Examiner*—Jack B. Harvey
*Assistant Examiner*—Glenn W. Brown

[57] ABSTRACT

In a method and apparatus for detecting and locating a quench zone in a superconducting coil, a sensor is positioned adjacent to and in heat transfer communication with the entire length of the superconducting coil. When a portion of the superconducting coil becomes normal, the adjacent portion of the sensor becomes resistive. A series of electrical pulses sent along the sensor are reflected back by the discontinuity in impedance which occurs at such a normal zone. The reflected pulses and echo pulses produced by various terminations on the sensor are detected by an associated receiver and processor which calculates the location of the resistive zone along the sensor and the corresponding quench zone along the superconducting coil using information derived from the pulses. A second embodiment provides two sensors which are adjacent to and in heat transfer communication with the coil which are pulsed from opposite ends.

11 Claims, 2 Drawing Sheets

SUPERCONDUCTOR QUENCH MEASURING DEVICE WHICH EVALUATES REFLECTED PULSES

BACKGROUND OF THE INVENTION

1. Field of the Invention

This invention relates to an apparatus and method for detecting and locating quench zones in a superconducting coil using a sensor positioned adjacent to the superconducting coil and being in heat transfer communication with the coil, and evaluating echo pulses reflected due to changes in the resistance on the transmission line.

2. Background Information and Description of the Prior Art

Superconducting inductors (or magnets) are capable of storing large amounts of energy. In addition, these superconducting inductors (or magnets) also generate high magnetic fields. Superconducting inductors are very efficient for these purposes because no energy is lost due to resistive heating in the superconducting current path. Superconductors are operated at cryogenic temperatures. Such temperatures are extremely low, being slightly above absolute zero. For a given ambient magnetic field, a superconducting material has a critical temperature above which the material is no longer superconducting. Above the critical temperature, resistance increases in the area where the material is no longer superconducting.

If a region of a superconducting coil becomes resistive and no longer acts as a superconductor, this is known as becoming "normal" or "quenching". When a region of the superconductor becomes normal, joule heating of the normal region takes place. If sufficient joule heating occurs, the normal zone propagates and grows larger. This can be a catastrophic condition leading to severe damage in the coil as temperatures rapidly increase in the normal region. For this reason, early detection of a normal zone is extremely important. Early detection of the normal zone can permit an opportunity to dissipate the energy stored in the coil often by shunting the energy away from the normal region or sometimes by quenching the entire coil. Catastrophic damage due to overheating can thereby be avoided.

Several methods for detecting normal regions in a superconducting coil have been known. The primary technique has involved the use of voltage taps. In accordance with this method, voltages are measured at various points along the coil with the objective of correlating changes in voltage with the existence of normal regions. A drawback of using voltage taps in the case of a superconducting inductor is that in addition to the resistive voltage associated with a normal zone, a superconducting inductor exhibits inductive voltages resulting from the charging or discharging of energy in the coil. Although the normal zones must be detected when they are small, the inductive voltage between the two taps is usually much larger than the resistive voltage even for a severe quench. Therefore, the large inductive voltage must be eliminated from the total voltage measured at the taps. Typically, this involves subtracting out the inductive voltage by comparing the signal to a reference value in order to determine the resistive voltage. The reference voltage is obtained from a sense coil monitoring the magnetic field, or it may be a voltage obtained from a voltage tap at a different location on the inductor. As noted, the technique involves subtracting two voltage measurements to determine the small resistive component. This can result in inaccurate readings due to the complications inherent with such a technique.

Furthermore, the information obtained by using the voltage tap technique is limited to determining whether a normal zone exists between the two voltage taps. The exact position of the normal zone between the taps cannot be determined with this technique. In addition, the inductive voltages in the coil may sum up to tens of kilovolts across the inductor terminal. In practice, this places severe constraints on the electronic components which are used for the voltage taps. In order to accurately locate the position of a quench along a superconducting coil, in addition to merely detecting that a quench exists, numerous voltage taps must be used. However, this results in numerous penetrations into the dewar leading to heat leaks, which can raise the temperature of the adjacent portion of the coil and in turn contribute to quench zones occurring. Even small heat leaks affect the cost of operation and thermal efficiency of the overall system since many times the energy of a leak is required to reduce it.

It has been known to provide two superconducting strands to create a sensor which is then cowound with the superconducting coil. At one end of the sensor, the two strands may be shorted together. The overall sensor tends to be noninductive since one leg of the sensor has a positive inductive voltage and the second leg has a negative inductive voltage. Thus, the problem of an inductive voltage being detected is not presented in this technique. A voltage limited current source provides current to the sensor and a voltmeter detects resistive voltage in the sensor. While the main superconducting inductor itself is superconducting the cowound electrical sensor is also superconducting. Normal zones in the inductor drive the corresponding section of the cowound sensor normal through heat conduction. The resistance in the sensor can then be measured to detect the existence of a normal zone. As with the voltage tap methods, the cowound sensor method is limited to detecting the existence of a normal zone. The position of the normal zone along the sensor cannot be determined using this method. It is often important to know the location of a quench for purposes of maintenance and repair. The superconducting magnet may be located underground or in another location which is not readily accessible. If abnormal conditions or quench zones continually occur in a particular area of the coil, this area can be immediately targeted for repair or maintenance. Otherwise, the entire line would have to be inspected. Additionally, one of the primary concerns in superconducting technology is to avoid heat leaks into the refrigerated zone. However, unnecessary penetration into the dewar which may be necessary to locate a repair zone can lead to unnecessary heat leaks into the dewar.

Other limitations in the technique include a lack of selectivity between a long, slightly heated quench and a short hot quench as the total resistance measured in both such situations can be equal.

There remains a need, therefore, for a quench measuring device and method which will allow early detection of normal zones in a superconductor but which will also provide information about the location of the normal zone along the coil. There remains a further need for a device which will not require excessive penetrations into the dewar which can lead to heat leaks and increase the risk of voltage breakdowns. In addition, there remains a need for a device which will provide information as to the magnitude of the quench.

It is an object of this invention to provide a quench measuring system which detects a quench zone and provides information as to the location of the quench zone along the superconducting coil.

It is a more particular object of the invention to provide such a system which minimizes the possibility of heat leaks into the system and which eliminates the need for multiple components and voltage taps to be built into the system.

It is a further object of the invention to provide a system in which a differentiation can be made between a long slightly heated quench and a short hot quench.

SUMMARY OF THE INVENTION

These and other objects and needs are realized by the present invention which is directed to a quench measuring system for use with a superconducting inductor or magnet. The quench measuring system includes a sensor which acts as a transmission line. The sensor is composed of two strands of, preferably, superconducting wire with a dielectric material coated around the wires. The type of wire, the dielectric material and the dimensions of each are chosen such that the sensor will have a predetermined characteristic impedance, $Z_o = \sqrt{L/C}$ where L is the inductance per unit length and C is the capacitance per unit length. This also assumes no losses on the line. The sensor is disposed adjacent to and in heat transfer communication with the superconductor along the entire length of the main superconductor. The sensor is preferably electrically isolated from the main superconducting coil, while being in thermal communication with the superconducting coil to allow heat conduction to take place between the coil and the sensor.

The sensor has a source end and a termination end. The sensor is heat sensitive such that when any area of the main superconductor becomes normal, creating a quench zone, a corresponding quench zone is also created in the sensor in a location adjacent to the quench zone of the main superconductor.

The system also includes a pulse generator which is disposed at the source end of the sensor. The source end of the sensor at which the pulse generator is located is set to have a resistance equal to the characteristic impedance of the sensor. The pulse generator sends forward pulses from the source end down the sensor line. A discontinuity created by a quench in the superconducting inductor results in a change in the resistance in the cowound sensor due to heat transfer between the main superconductor and the sensor. The change in sensor resistance so generated causes a discontinuity which in turn causes a reflection of the transmitted pulse in the form of an echo pulse. A suitable receiver is provided to detect the echo pulse received at the source end.

In accordance with one aspect of the invention, the sensor is terminated at a short circuit so that pulses sent along the sensor from the pulse generator will be reflected at the shorted end due to the mismatch in impedances. The pulse is reflected back to the source end, but opposite in sign to the original pulse. Using this short-circuited transmission line, a base line echo for the sensor can be obtained. Thereafter, any intermediate change in impedance which is located along the length of the sensor transmission line, such as that caused by a normal zone on the superconducting sensor, causes some of the energy in the forward pulse to be reflected back at the location of the normal zone on the sensor.

The magnitude and shape of the echo pulse caused by the normal zone is representative of the magnitude of discontinuity in the impedance. This relates to the magnitude of the quench zone. The time of arrival of the echo pulse indicates the position of the normal zone relative to the source end of the sensor. Using the timing information obtained, calculations may be performed in which the timing information is processed by an associated signal processor to determine the distance from the source end and, from this, the location along the superconducting coil of the quench zone can be determined.

In accordance with an alternative embodiment of the invention, the far end of the sensor is terminated with an open circuit. In that case, the pulse which is reflected back to the source end from the open-circuited end is of the same polarity as the transmitted pulse.

In a second embodiment of the invention, two cowound sensors run the length of the superconducting coil but these cowound sensors are each pulsed from opposite ends. This configuration provides additional information about the length of the normal zone. In addition, the two detectors can be used to provide redundancy and confirmation that a quench has occurred.

BRIEF DESCRIPTION OF THE DRAWINGS

The full understanding of the invention can be gained from the following description of the preferred embodiments when read in conjunction with the accompanying drawings in which.

DESCRIPTION OF THE PREFERRED EMBODIMENTS

Figure 1:
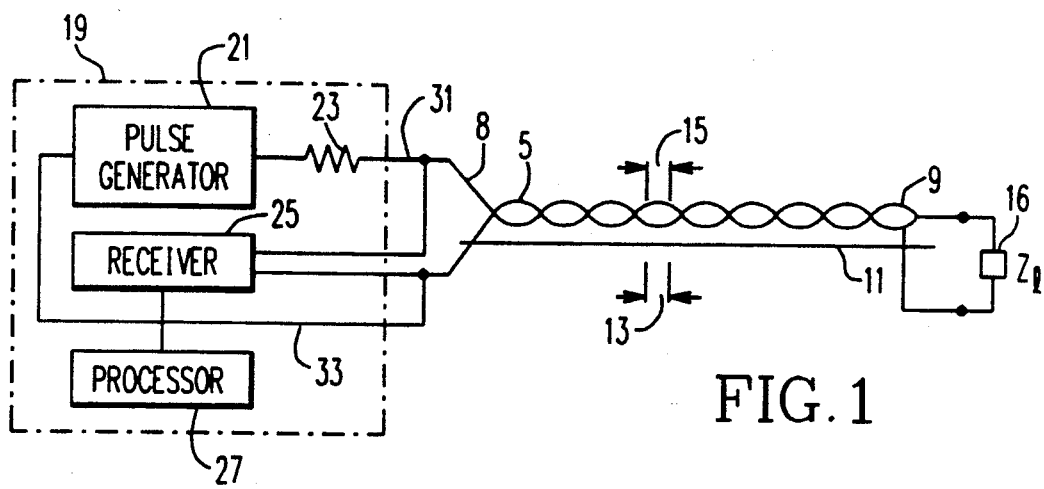
FIG. 1 is a schematic diagram of one embodiment of the present invention employing a single sensor.

Referring to FIG. 1, sensor device 5 is positioned adjacent to and in heat transfer communication with a superconducting coil 11 which is schematically illustrated in FIG. 1. Sensor 5 is shown as being adjacent superconducting coil 11 along its entire length. It is preferred that the sensor 5 remain electrically isolated from the coil 11. However, sensor 5 must be in sufficient proximity to coil 11 that heat is transferred by conduction or convection from the coil 11 to the sensor 5 for the reasons discussed hereinafter.

Figure 2:
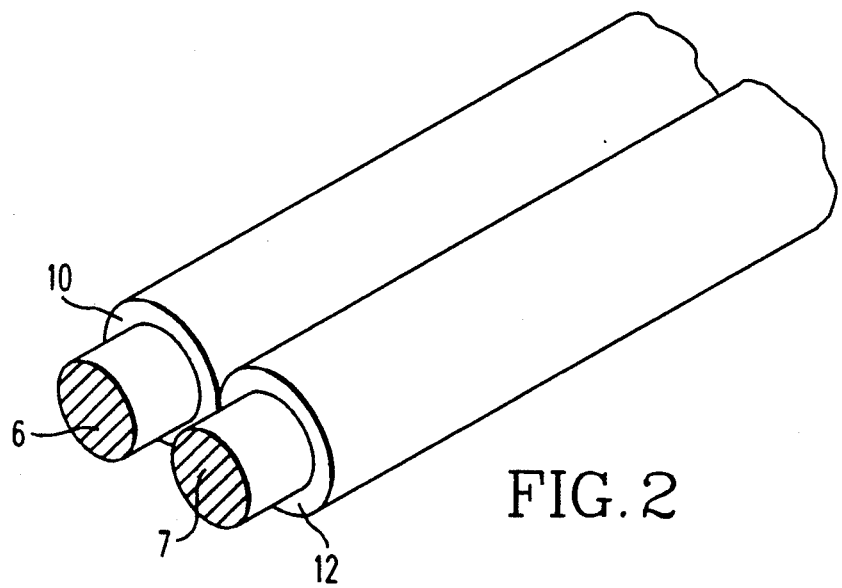
FIG. 2 is a schematic isometric drawing of the sensor of the present invention.

Referring to FIG. 2, sensor 5 is preferably formed of two strands of superconducting material which are intertwined to form a bifilar sensor. To create the bifilar sensor 5, two wires 6 and 7 of a predetermined diameter are chosen. The wires 6 and 7 shown in FIG. 2 are preferably composed of niobium titanium (NbTi), or any other material which is capable of exhibiting superconducting behavior in the desired application. Wires 6 and 7 do not have to be composed of superconducting material, but it is preferable that they are so composed. They must at least be composed of a conductive material which transmits the pulses and becomes resistive in the manner hereinafter discussed. Wires 6 and 7 are coated with a dielectric material such as material 10 which coats wire 6 and material 12 which coats wire 7. Material 10 and 12 is preferably a film insulation material known as PYRE-ML, commercially available from E. I. DuPont de Nemours and Company of Wilmington, Del., or a material known as OMEGA which is commercially available from Westinghouse Electric Corporation of Pittsburgh, Pa. The diameter of wires 6 and 7 and the thickness of dielectric material 10, 12 are selected such that the sensor 5 has the desired characteristic impedance for the application. For example, the NbTi wires 6 and 7 may be about 0.0031 inches in diameter and may be wrapped with about an 0.002 inch thick film of dielectric material 10, 12. This provides a sensor having a transmission line characteristic impedance of about 100 ohms. The sensor 5 with such dimensions also has about a 6 nanosecond per meter delay.

As would be understood by those skilled in the art, the geometry of sensor 5 and the material chosen for wires 6 and 7 and dielectric material 10, 12 cause the overall sensor 5 to behave such that when a transmitted pulse which is sent along sensor 5 reaches an area of impedance discontinuity, this causes a reflected pulse to be sent back to source end 8 of sensor 5. Furthermore, the reflected pulse is representative of the magnitude and size of the quench zone. A large impedance existing along the sensor 5 will result in a larger pulse height than would result from a smaller impedance level. The location of the quench zone is obtained from timing calculations as discussed hereinbelow.

As noted, the sensor 5 is positioned adjacent to and in heat transfer communication with a superconducting coil 11 (FIG. 1). The superconducting coil 11 may be a superconducting inductor or a superconducting magnet. In the exemplary embodiment, a superconducting inductor is discussed. Sensor 5 has a source end 8 and a termination end 9.

As would be understood by those skilled in the art, normal zones where the superconducting coil 11 becomes resistive and is no longer superconducting can be created for a variety of reasons. Primarily, heat leaks which enter the dewar typically result in raising the temperature of the superconducting inductor above the critical superconducting temperature for that coil. When the temperature is raised, the coil 11 no longer is superconducting. A normal zone such as, for example, zone 13 in superconducting coil 11 also drives corresponding section 15 of sensor 5 normal through heat conduction.

In accordance with the present invention, the superconducting sensor 5 is treated as a transmission line. High speed short electrical pulses are sent along sensor 5. When a section of bifilar sensor 5 is driven normal by a corresponding portion 13 of the superconducting coil 11, the impedance of that section 15 of the cowound sensor 5 changes. The resulting discontinuity in resistance reflects a portion of the incoming pulse energy back to a source end 8 of sensor 5 in the form of pulses. These reflected pulses are used to both detect and locate normal zones or quenches.

More specifically and referring still to FIG. 1, an instrumentation module indicated by the dashed box 19 includes pulse generator 21, receiver 25 and processor 27. These components are conventional and would be available to those skilled in the art. Pulse generator 21 is located at source end 8 of sensor 5. Pulse generator 21 has a source resistance, $R_s$, which is schematically illustrated by component 23 in FIG. 1. It is desired to match source resistance 23 with the characteristic impedance, $Z_o$, of sensor 5. In practice the pulse generator 21 will have a given resistance which will make up some of the total source resistance 23 and the remainder will be lumped and adjusted for a proper match $R_s = Z_o$, as would be readily understood by those skilled in the art. Pulse generator 21 generates a short electrical pulse which is transmitted along lines 31 and 33 to source end 8 of sensor 5. In accordance with a preferred embodiment of the invention, sensor 5 is terminated by a short circuit at termination end 9 so that echo pulses will be reflected back to the source end 8 from the short circuited termination end 9 due to the mismatch between the characteristic impedance $Z_o$ of the sensor 8 and the impedance at the short-circuited end 9 which is zero. As would be understood by those skilled in the art, the reflected pulse will be opposite in sign to that of the incoming transmitted pulse.

Alternatively, termination end 9 may be an open circuit. In the open circuit configuration, the return pulses would be of the same sign as the transmitted pulse. This alternate configuration is shown in FIG. 2 which shows bifilar sensor 5 having an open circuited end.

In accordance with yet a further embodiment of the invention a predetermined resistance 16 can be provided at termination end 9 to create the desired impedance mismatch. As noted hereinbefore, as long as there is a mismatch a pulse will be reflected back to source end 8. If, on the other hand, it is not desired to generate the reflected pulse, a resistance matching the characteristic impedance $Z_o$ may be placed at termination end 9 of sensor 5. It is preferred, however, to provide a short circuit at termination end 9. Using this technique, a base line echo can be established. Any discontinuity caused by a change in resistance occurring in an intermediate location along the length of sensor 5 causes some of the energy in the pulse to be reflected from the location of the normal zone 15 (which is actually a discontinuity in resistance) on sensor 5. Then, the base line echo pulse is reflected back to receiver 25 which indicates the end of a pulsing cycle.

As noted above, it should be understood that it is not necessary for purposes of the invention to provide that a return pulse is reflected from termination end 9. For example, if termination end 9 is terminated by $R_l = Z_o$ there would be no return echo from termination end 9. However, it is preferred to provide for such a pulse in order to confirm that the system is operating and to simplify the timing calculation performed to determine the location of the quench zone. In practice there may be circumstances in which the reflective pulse is undesired.

Figure 3:
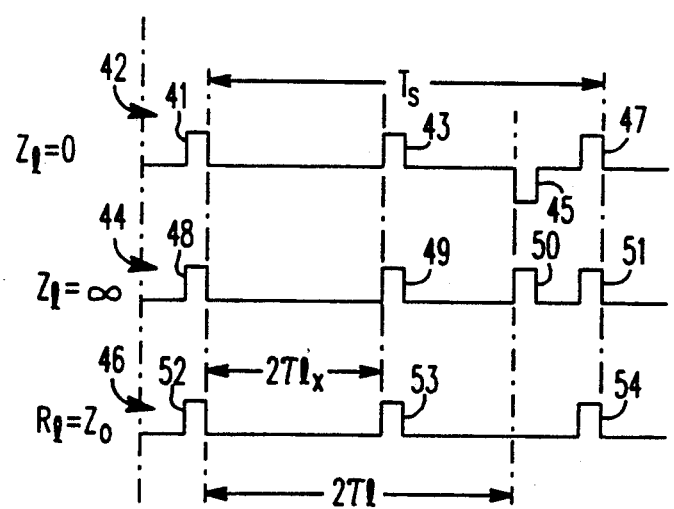
FIG. 3 is a schematic illustration of the pulse train and the returning echo pulses generated in accordance with the present invention.

Referring to FIG. 3, the pulse train of the present invention is discussed in further detail. Transmitted pulse 41 is generated by pulse generator 21 in the example shown in graph 42 of FIG. 3. In the circumstances of graph 42, termination end 9 is short-circuited so that $Z_l = 0$, where $Z_l$ is the impedance at termination end 9. In this example, a resistive portion exists in sensor 5 so that a discontinuity exists which causes echo pulse 43 to be reflected. Thereafter, reflected pulse 45 returns from termination end 9. Thereafter, the next transmitted pulse 47 is generated. The period between pulses, $T_s$, varies depending upon the circumstances, but a typical value for $T_s$ would be about 500 microseconds. A typical pulse width for transmitted pulses 41 and 47 may be about 100 seconds, depending upon the length of the line. The time it will take for echo pulse 43 to return from a discontinuity location may be determined by the following equation:

$$t_{ECHO} = 2\tau l_x \qquad \text{Eq. (1)}$$

where $l_x$ is the distance between source end 8 and the discontinuity 15 in sensor 5 (FIG. 1); and $\tau$ is a propagation delay constant relating to the inherent delay created by the materials used for sensor 5 as would be understood by one skilled in the art. Similarly, the time elapsed before reflected pulse 45 is reflected back to source end 8 will be given by:

$$t_{TOTAL} = 2\tau l \qquad \text{Eq. (2)}$$

where $l$ is the full length of sensor 5. Using Equations 1 and 2, and when the times $t_{echo}$ and $t_{total}$ are measured. The location $l_x$ of a discontinuity 15 (FIG. 1) may be determined.

Referring still to FIG. 3, graph 44 depicts the case in which end 9 is terminated in an open circuit such that $Z_l = \infty$. Transmitted pulse 48 is initially generated. If a discontinuity exists, an echo pulse 49 will be reflected as discussed above Within a time period equal to $2\tau l$, a return pulse 50 is generated. The return pulse 50 in this case is of the same polarity as that of transmitted pulse 44. The next transmitted pulse 51 is generated within period, $T_s$.

The case of a resistance value being placed at end 9 which is equal to $Z_o$ is depicted in graph 46 of FIG. 3. Transmitted pulse 52 is followed by echo pulse 53 indicating that a discontinuity exists on the line. However, no reflected pulse is generated at end 9 because there is no impedance mismatch at termination end 9 in the example of graph 46. Instead, echo pulse 53 is reflected at time $2\tau l_x$ and then next transmitted pulse 54 is generated at the time equal to the period of the pulse train.

As noted herein, the location of the quench zone is determined using the information calculated from Equations 1 and 2. In this way, the location of a quench zone may be determined. In addition, the echo pulse such as pulse 43 can be examined and the shape of the pulse can indicate the degree of severity of the quench. A square and clearly defined pulse indicates a short, hot quench. A less defined, curving pulse suggests an elongated quench. Furthermore, as shown in graphs 42 and 44 of FIG. 3, the magnitude of return pulses 45 and 50 are essentially equal to the magnitude of transmitted pulses 41 and 48, respectively. This is an indication that no discontinuity was detected and that there was negligible loss in the entire line.

For the timing calculations to be performed properly, the repetition rate of the pulse train is selected based upon the length and propagation delay of coil 11. It is noted that the full length of coil 11 is covered by sensor 5 but sensor 5 is actually longer than coil 11 because it is preferably twisted. A typical repetition rate for a long superconducting coil on the order of tens of kilometers in length would include 100 nanosecond pulses being about 500 microseconds apart. The repetition rate is selected such that the echo occurs in the unambiguous range of the line. In other words, the timing is set so that discontinuity echoes clearly occur between the sending of the pulse and the return pulse. This would be well understood by one skilled in the art in that in a typical application, there may be a range of approximately ten seconds during which a decision must be made to dissipate energy from the system if a growing quench is detected. This repetition rate of the pulses provides two thousand observations per second so that a quench condition can be fully examined by a processor many times to confirm the existence of a quench zone before action must be taken. Having many samples and substantial time permits signal averaging techniques to be used which improve the signal to noise ratio and hence improve certainty.

Figure 4:
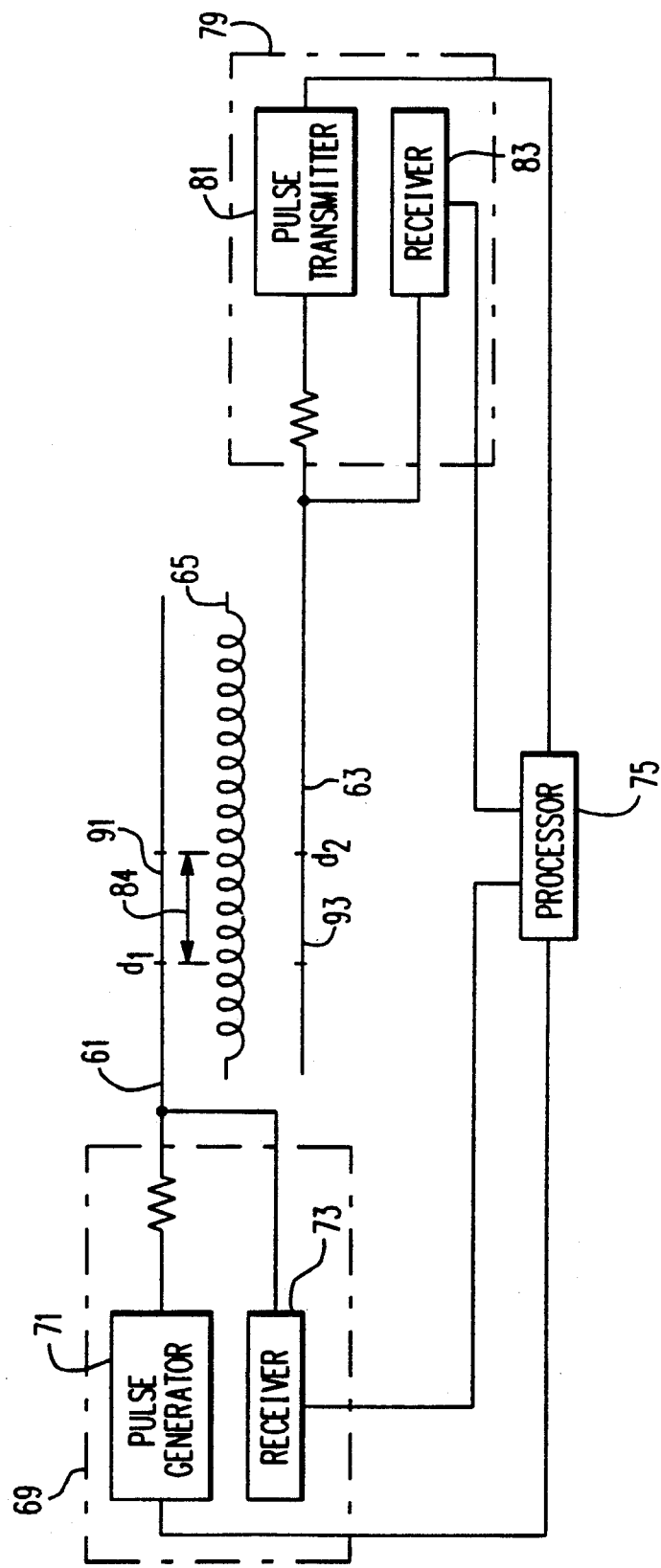
FIG. 4 is a schematic illustration of another embodiment of the present invention employing dual sensors.

In accordance with another aspect of the invention, a system for measuring quench zones includes two sensors in order to obtain further information about the location and the length of the quench zone in a coil. Referring to FIG. 4, first sensor 61 and second sensor 63 are provided adjacent to coil 65. First sensor 61 and second sensor 63 are positioned adjacent to coil 65 such that there is heat transfer communication between sensors 61 and 63 and coil 65. Preferably, first sensor 61 is a bifilar sensor prepared in the manner described above. A first pulse generating assembly 69 is associated with first sensor 61. First instrumentation module 69 includes pulse generator 71 which is a conventional pulse generating transmitter that would be understood by those skilled in the art. Additionally, first instrumentation module 69 has first receiver 73. Processor 75, may be associated with the overall system and it is connected to receive information from receiver 73 for evaluating the returning echo pulses from first sensor 61.

The system also includes second sensor 63 which is also a bifilar sensor positioned adjacent to coil 65 as described hereinbefore. Second sensor 63 has associated therewith second instrumentation module 79. Second instrumentation module 79 includes second pulse generator 81, second receiver 83 and it communicates with processor 75.

First pulse generator 71 and second pulse generator 81 transmit pulses, such as pulse 41 (FIG. 3), which are sent along first and second sensors 61 and 63, respectively. If a quench zone, such as zone 89, exists in coil 65 a corresponding quench zone 91 will be generated through heat transfer in first sensor 61. Similarly, a corresponding quench zone 93 will be generated in second sensor 63 by heat transfer. An incoming pulse proceeds along first sensor 61 in a first direction until a portion of the energy of the pulse is reflected at point $d_1$ and returned during time $t_1$ to be detected by receiver 73. Time $t_1$ is stored in processor 75. Similarly, when a pulse such as pulse 41 is generated by second pulse generator 81 and sent across second sensor 63 in a direction opposite to the first direction, it is reflected at point $d_2$ and is detected at time $t_2$ by receiver 83. This information is similarly stored in processor 75. The size of the quench zone 89 can be determined by processor 75 by a suitable program which determines the distance $d_1$ along coil 65 utilizing the information about time $t_1$ and the short circuit delay constant as discussed above. Similarly, distance $d_2$ is calculated using time $t_2$ information. The overall length of coil 65 is known, so the length of quench zone 89 can be determined using $d_1$ and $d_2$. This assumes that one long quench zone exists along coil 65. As stated hereinbefore, a great deal can be determined from the pulse shapes. For example, the discontinuity at $d_1$ and $d_2$ can be detected by receivers 73 and 83. Further, the amount of energy lost in the discontinuity can be confirmed by the end of line reflected pulse, such as 47, for each system. The results for each sensor 61 and 63 can then be compared and confirmed.

This second embodiment of the invention can also be used to provide redundancy and confirmation that a quench zone exists. For increased redundancy, processor 75 may actually include a third system and its results can be combined with the results from the other systems for sensors 61 and 63.

As an alternative to processor 75 which may be a traditional signal processing system, a system utilizing neural network logic could be used to examine the echo pulse shapes.

In accordance with the method of the present invention, the method involves a single sensor such as sensor 5 of FIG. 1 or first and second sensors 61 and 63 such as shown in FIG. 4 which are provided adjacent and in heat transfer communication with a superconducting coil. Suitable pulse generators, receivers and processing assemblies are also provided. A pulse train having a suitable repetition rate as discussed hereinbefore is generated by the pulse generator such as generator 71. Similar pulses are generated by pulse generator 81. The timing between pulses is chosen so that there is a nonambiguous time during which the echoes and discontinuity pulses, if any, are detected. If the coil, and accordingly the transmission line, are long enough, time is needed between pulses to correctly evaluate the echo pulses. This actually is an advantage to the timing process because a long coil allows further time to perform the processing. However, this also needs to be balanced against the need to respond quickly to a quench. Therefore, the pulses must be as close together as possible without introducing an ambiguity into the measuring system. Using the timing information determined from the reflected discontinuity echoes and the length of the coil 11, the location of a quench can be easily and quickly determined.

It should be understood that the present invention provides a method and apparatus for locating and detecting quench zones in a superconducting coil while requiring minimal penetrations into the dewar. In addition, the simplicity of the design avoids the need to employ large quantities of electrical components and wiring. Further, both detection of a quench and the location and severity of the quench can be determined using the method and apparatus of the present invention. This is extremely useful, especially in applications in which a long superconducting coil is used for energy storage, because the area requiring maintenance can be accurately pinpointed. This greatly simplifies repair measures when the coil is located underground or in another location which is not readily accessible. Additionally, hot quench zones can be observed and evaluated for possible preventative maintenance.

While specific embodiments of the invention have been described in detail, it will be appreciated by those skilled in the art that various modification and alternatives to those details could be developed in light of the overall teachings of this disclosure. Accordingly, the particular arrangements disclosed are meant to be illustrative only and not limiting as to the scope of the invention which is to be given the full breadth of the appended claims and any and all equivalents thereto.

What is claimed is:

1. A quench measuring device for a superconducting coil, comprising: sensor means comprising a first sensor and a second sensor, said first and second sensors each being composed of conductive material and each having a characteristic impedance, a source end and a termination end, said first and second sensors being positioned adjacent to and in heat transfer communication with said superconducting coil along substantially the entire length of said superconducting coil such that when a portion of said coil becomes normal creating a quench zone, corresponding resistive zones are created in each of said first and second sensors of said sensor means; pulse generating means including a first pulse generator located at said source end of said first sensor, said source end of said first sensor being disposed generally at one end of said superconducting coil for transmitting electrical pulses in a first direction along said first sensor at a predetermined repetition rate such that a first echo pulse is reflected at a first end of a said resistive zone, and said pulse generating means also including a second pulse generator located at said source end of said second sensor, said second pulse generator being disposed generally at an opposite end of said superconducting coil for transmitting electrical pulses in a second direction opposite to said first direction, said pulses being transmitted along said second sensor at a predetermined repetition rate such that a second echo pulse is reflected at a second end of said resistive zone in said second sensor; and receiving means comprising a first receiver associated with said first sensor for detecting said first echo pulses and a second receiver associated with said second sensor for detecting said second echo pulses.

2. The device of claim 1 wherein
said termination ends of each of said first and second sensors are provided with an impedance which mismatches the characteristic impedance of the first and second sensors such that a first return pulse is reflected back to said source end of said first sensor when said transmitted pulse from said first generator reaches said termination end of said first sensor and a second return pulse is reflected back to said source end of said second sensor when said transmitted pulse from said second generator reaches said termination end of said second sensor.

3. The device of claim 2 wherein
said first and second receivers have associated therewith processing means for measuring various time intervals between said first and second transmitted pulses, said first and second echo pulses, and said first and second return pulses from said first and second sensors, respectively.

4. The device of claim 3 wherein
said termination end of said first sensor and said termination end of said second sensor are short-circuited and said first and second return pulses reflected from said short circuits are opposite in polarity from said first and second transmitted pulses, respectively.

5. The device of claim 3 wherein
said termination end of said first sensor and said termination end of said second sensor are open-circuited and said first and second return pulses reflected from said short circuits are of the same polarity as that of said first and second transmitted pulses, respectively.

6. The device of claim 3 wherein
said termination end of each said first and second sensors has a resistive component connected thereto having a predetermined resistance.

7. A method of locating quench zones in a superconducting coil, including the steps of:
providing a first and second sensor means each composed of a conductive material and having a characteristic impedance and a source end and a termination end and providing said sensor means adjacent to and in heat transfer communication with said superconducting coil such that quench zones in said superconducting coil create corresponding resistive zones in said first and second sensors adjacent said quench zone creating a mismatch in impedance along said sensor means, generating a first series of electrical pulses and transmitting said pulses in said first sensor from said source end in a first direction at a predetermined repetition rate to establish a first echo pulse at any resistive zone in said first sensor, generating a second series of electrical pulses and transmitting said pulses in said second sensor from said source end in a second direction which is opposite to said first direction along said second sensor at a predetermined repetition rate to establish a second echo pulse at any resistive zone in said second sensor, calculating a first time interval between transmission of said first transmitted pulse and receipt at said source end of the first sensor of said first echo pulse, calculating a second time interval between transmission of said second transmitted pulse and receipt at said source end of the first sensor of said second echo pulse, and determining from the first and second time intervals the location and length of said quench zone of said superconducting coil.

8. The method of claim 7 including the steps of generating an impedance mismatch at said termination end of said first sensor to establish first return pulses from said termination end of said first sensor and generating an impedance mismatch at said termination end of said second sensor to establish second return pulses from said termination end of said second sensor, and calculating the time interval between said first echo pulse and said first return pulse and calculating the time interval between said second echo pulse and said second return pulse to determine further information about said quench zones from said time intervals.

9. The method of claim 8 including
generating said impedance mismatch by providing a short circuit at said termination end of each of said first and second sensors to establish return pulses from said termination ends of said first and second sensors.

10. The method of claim 8 including
generating an impedance mismatch by providing an open circuit at said termination end of each of said first and second sensors to establish return pulses from said termination ends of said first and second sensors.

11. The method of claim 8 including
generating an impedance mismatch by providing a resistance of predetermined value at said termination end of each said first and second sensors to establish return pulses from said termination ends of said first and second sensors.

* * * * *